(12) United States Patent
Teschner et al.

(10) Patent No.: US 9,117,637 B2
(45) Date of Patent: Aug. 25, 2015

(54) REDUNDANT ANODE SPUTTERING METHOD AND ASSEMBLY

(75) Inventors: Goetz Teschner, Dresden (DE); Falk Milde, Dresden (DE); Enno Mirring, Arnsdorf OT Kleinwolmsdorf (DE); Frank Meissner, Coswig (DE); Goetz Grosser, Dresden (DE)

(73) Assignee: VON ARDENNE GmbH, Dresden (DE)

( * ) Notice: Subject to any disclaimer, the term of this patent is extended or adjusted under 35 U.S.C. 154(b) by 1369 days.

(21) Appl. No.: 12/092,279

(22) PCT Filed: Nov. 6, 2006

(86) PCT No.: PCT/DE2006/001942
§ 371 (c)(1),
(2), (4) Date: Jul. 31, 2008

(87) PCT Pub. No.: WO2007/051461
PCT Pub. Date: May 10, 2007

(65) Prior Publication Data
US 2008/0308410 A1  Dec. 18, 2008

(30) Foreign Application Priority Data

Nov. 4, 2005  (DE) .......................... 10 2005 053 070
Feb. 15, 2006  (DE) .......................... 10 2006 007 186

(51) Int. Cl.
*H01J 37/34* (2006.01)
*H01J 37/32* (2006.01)
(Continued)

(52) U.S. Cl.
CPC .......... *H01J 37/3444* (2013.01); *C23C 14/354* (2013.01); *C23C 14/564* (2013.01);
(Continued)

(58) Field of Classification Search
CPC .............. H01J 37/3438; H01J 37/3444; H01J 37/3408; H01J 37/32532; H01J 37/3405; C23C 14/354; C23C 14/564
USPC ........................... 204/192.12, 298.14, 298.19
See application file for complete search history.

(56) References Cited

U.S. PATENT DOCUMENTS 4,478,702 A * 10/1984 Gillery et al. ............ 204/298.19
4,619,755 A * 10/1986 Hessberger et al. ...... 204/298.14
(Continued)

OTHER PUBLICATIONS

Belkind A; Zhao Z; Scholl R: "Dual-anode magnetron sputtering" Surface and Coatings Technology, vol. 163-164, Jan. 30, 2003, pp. 695-702, XP002427175.
(Continued)

*Primary Examiner* — Michael Band
(74) *Attorney, Agent, or Firm* — Heslin Rothenberg Farley & Mesiti P.C.

(57) ABSTRACT

A method is provided for coating a substrate with the aid of a magnetron cathode and two electrodes which are alternately impinged upon by a positive potential and a negative potential. Also disclosed is an assembly for coating a substrate, comprising a vacuum chamber, a magnetron cathode, two electrodes, and a voltage source. A negative potential is generated at a level that is no greater than the level of the cathode potential, thus preventing the electrode that is to be cleaned from being stripped to a greater extent than the same was coated in the previous half-wave. The magnetron cathode and the electrodes are connected to the voltage source via switching elements without being galvanically such that a negative and a positive voltage generated from the voltage source can be alternatively applied to the electrodes, the level of said voltage being no greater than the cathode voltage.

20 Claims, 10 Drawing Sheets

(51) Int. Cl.
*C23C 14/35* (2006.01)
*C23C 14/56* (2006.01)

(52) U.S. Cl.
CPC ....... *H01J37/32532* (2013.01); *H01J 37/3408* (2013.01); *H01J 37/3405* (2013.01); *H01J 37/3438* (2013.01)

(56) References Cited

U.S. PATENT DOCUMENTS

| | | | |
|---|---|---|---|
| 5,616,225 A | 4/1997 | Sieck et al. | |
| 5,897,753 A * | 4/1999 | Schatz et al. | 204/192.12 |
| 5,917,286 A * | 6/1999 | Scholl et al. | 315/111.21 |
| 5,993,613 A * | 11/1999 | Manley | 204/192.12 |
| 6,183,605 B1 | 2/2001 | Schatz et al. | |
| 6,440,280 B1 * | 8/2002 | Burton et al. | 204/298.06 |
| 6,818,103 B1 | 11/2004 | Scholl et al. | |

OTHER PUBLICATIONS

International Search Report for PCT/DE2006/001942, dated Mar. 28, 2007.

* cited by examiner

FIG 1 State of the art
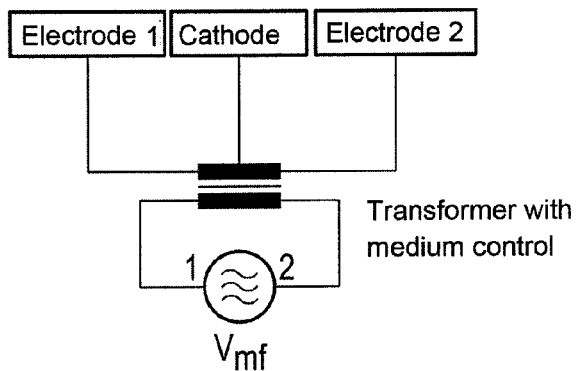
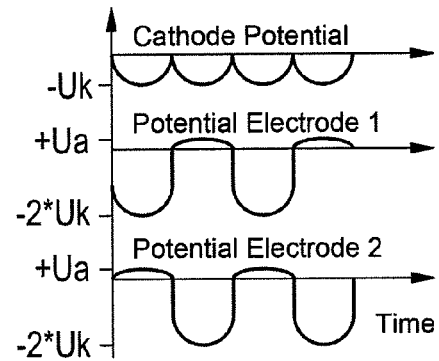
FIG 2
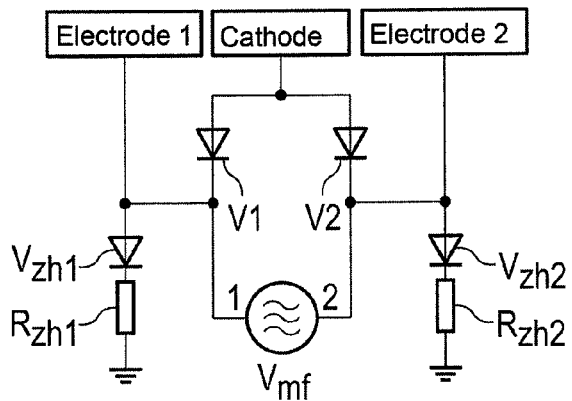
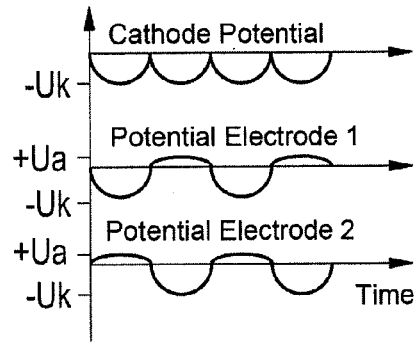
FIG 3
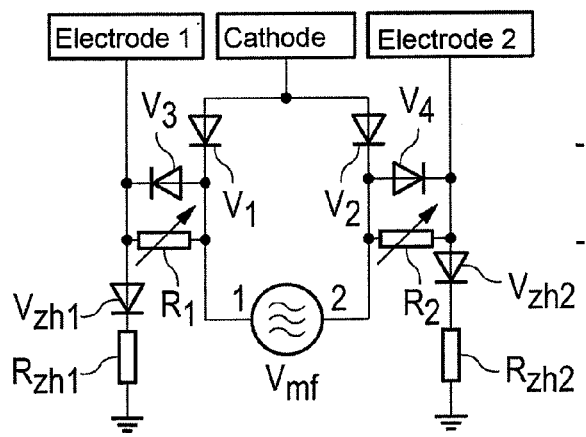
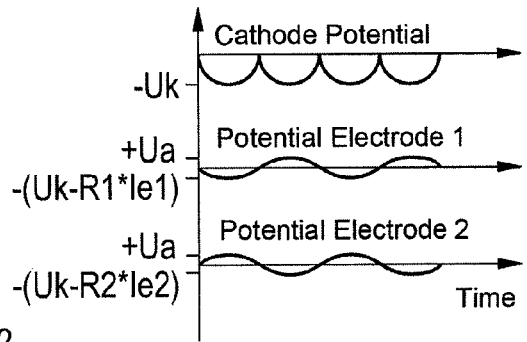

FIG 4
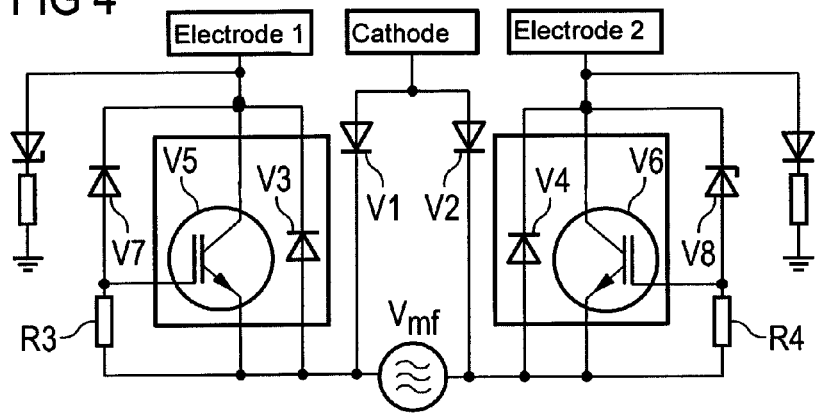
FIG 5
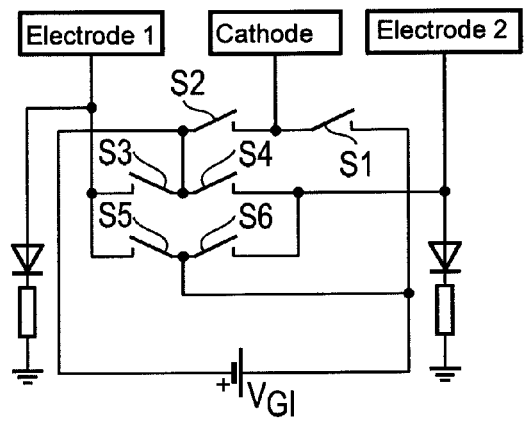 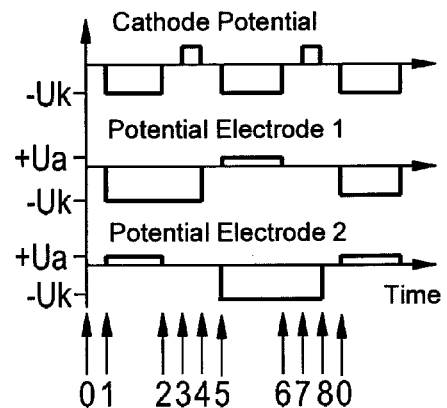
FIG 6
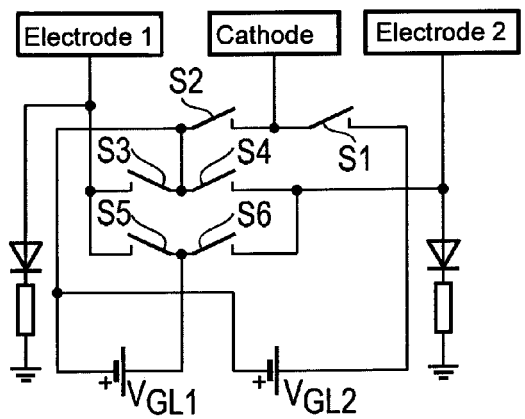 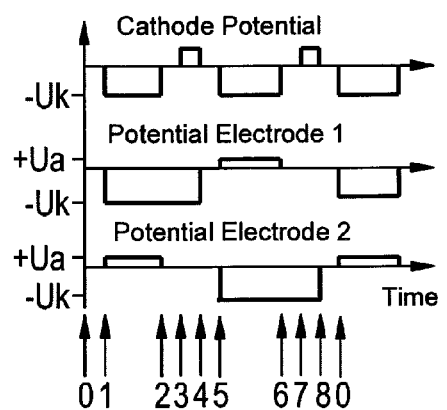

FIG 7
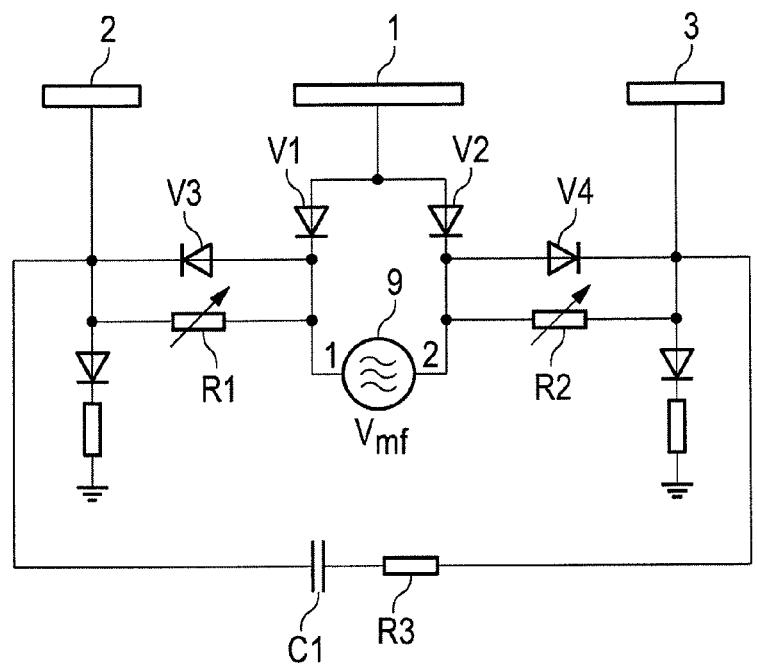
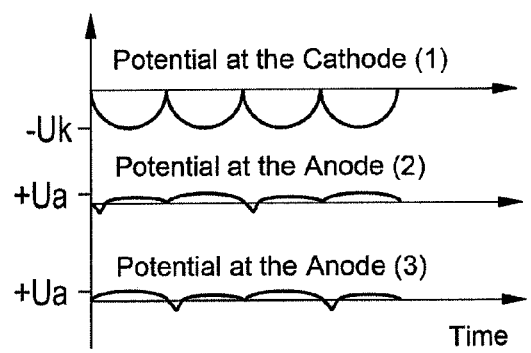

Vacuum   Atmosphere

REDUNDANT ANODE SPUTTERING METHOD AND ASSEMBLY

CROSS REFERENCE TO RELATED APPLICATIONS

This application is a national stage filing under section 371 of International Application No. PCT/DE2006/001942, filed on Nov. 6, 2006, and published in German on May 10, 2007 as WO 2007/051461 and claims priority of German application Nos. 10 2005 053 070.2 filed on Nov. 4, 2005, and 10 2006 007 186.7 filed on Feb. 15, 2006, the entire disclosure of these applications being hereby incorporated herein by reference.

BACKGROUND ART

The invention relates to a method for coating a substrate by the use of redundant anode sputtering of a target on a cathode, designed as a magnetron. In this case the cathode is supplied with a negative cathode potential; and, besides the cathode, two electrodes are alternately supplied with a positive potential (anode potential) or with a negative potential.

The invention also relates to a device, which is intended for coating a substrate by the use of redundant anode sputtering and which comprises a vacuum chamber, a magnetron cathode, two electrodes and a voltage source.

Vacuum coating technology for optical applications requires transparent oxide layers. According to the current state of the art, these layers are produced, as a function of the material, with direct current methods or with alternating current methods.

To this end, magnetron cathodes—planar or cylindrical—are provided with material to be deposited and are operated in a pure argon atmosphere or in a reactive atmosphere in a cathode sputtering process (sputtering process).

The major problem with a sputtering process for oxides or nitrides lies in the fact that unfortunately not only the substrates but also all other surfaces in the coating zone are coated with material having poor conductivity. This coating also takes place on the anodes, which are used in the sputtering process. This coating of the anodes with a material having poor conductivity or with a non-conductive material impedes the current flow and in extreme cases may even totally suppress the flow of current.

Outside the vacuum this coating with a material having poor conductivity may be detected by an increase in the anode voltage. This additional voltage drop causes a loss of power and leads to instability in the coating process.

When higher requirements are imposed on the layer thickness uniformity of the substrate to be coated, it turns out that the anode, which is covered with material, results in a non-uniformity of the layer thickness. The reason for this non-uniformity of the layer thickness lies in the fact that the anode is not uniformly coated by the insulating material, so that the current flows preferably to certain zones of the anodes. This non-uniform current flow over the length of the anodes is reflected in the plasma distribution of the sputtering cathode; and then the plasma concentrates on the area that continues to be the best conductive.

In addition, this current distribution is not constant in terms of time, so that the distribution of the layer thickness changes over time.

In order to ensure a stable current distribution on the anodes, a wide variety of attempts have been made—for example, the EP 0 632 142, WO 92/09718—however, in the final end without any outstanding success.

One solution to these problems is the twin magnetron system, wherein the discharge is carried out with alternating current between two identical magnetrons. Both targets are operated alternatingly as an anode and as a cathode. In the cathode phase the surface is cleaned of the back coatings from the anode phase, so that the discharge always meets with an uncoated anode. In this way the problem of the coated anode is solved for this system. However, twin magnetrons that are operated in the alternating mode are associated with not only increased complexity but also with technological drawbacks.

If a magnetron is operated as an anode, the anode voltage is higher than in the case of an anode without a magnet system. The electrons of the discharge are impeded from penetrating into the target surface by the magnet system. This impedance by the magnetic field affects the current distribution in the discharge. The result is a stationary non-homogeneity in the discharge, which is called the "cross corner effect" in the scholarly literature.

It is true that the twin magnetron has significantly improved the temporal stability, but the local layer thickness uniformity has become worse in comparison to that in a single magnetron.

This drawback can be remedied with a RAS circuit, as described in the patent U.S. Pat. No. 6,183,605 B1. RAS stands for redundant anode sputtering—that is, cathode sputtering with an additional anode.

To this end, the circuit, depicted in FIG. 1 (state of the art) is used. In this case the magnetron is connected to the central tap, and the electrodes are connected to one of the external connectors respectively of the secondary coil of a transformer; and its primary coil is fed by the medium frequency generator Vmf.

The magnetron always remains negative; and the two electrodes alternate the polarity.

Whereas a first electrode acts as the "correct" anode in the discharge (that is, accepts a positive voltage in relation to the vacuum tank), the second electrode will have, according to the law of transformers, twice the voltage of the magnetron and, thus, be extremely negative. Thus, this second electrode draws positive ions from the magnetron discharge; and said positive ions lead to the ion bombardment of the second electrode. The result is that the electrode is ion-etched.

In the next half cycle the polarity of the electrodes is reversed so that at this stage the discharge is provided with a clean anode.

The problem here is that owing to the transformer that is used, the voltage at the negative electrode is permanently defined—that is, the value of twice the burning voltage of the magnetron.

Since the ion density in a magnetron discharge is very high, the electrode to be cleaned experiences an extensive stripping that is significantly greater than the coating in the preceding half cycle.

This stripping results not only in the abrasion of the electrodes but also in the contamination of the layers to be generated with the magnetron sputtering device.

It has been proposed to make the electrodes of the same material as the target of the magnetron. However, that leads to problems in the case of targets that have low conductivity or targets that are made of brittle materials that cannot be processed. Owing to these limitations RAS technology, which has been known for a long time, could not gain acceptance.

The solution of "hiding" the anode leads to an analogous situation. The basic idea of this method, which has been practiced for a long time, is to arrange the anodes behind apertures, so that the sputtered particles can reach the anode only after multiple surges. If the opening to the cathode is adequately small, the dwell time of the anodes can be significantly increased. Of course, the non-uniformity of the layer thickness has to be accepted, because for energy-related reasons the electron currents in the quasi-neutral plasma of the sputter discharge have to be concentrated into single paths, which in turn result in a degree of ionization that varies widely and, thus, in locally different coating rates. In the case of past requirements, which were lower, this was the way to coat on an industrial scale substrates with materials having poor conductivity. The major drawback is that the aforementioned electron paths are locally unstable, so that the layer thickness distribution on the substrates varies in an unpredictable way.

The classic arrangement for anodes is disclosed in the patent U.S. Pat. No. 4,046,659. In this case the anode carrying rod is located somewhat further away from the substrate than the target next to the cathode. This position is good from an electric viewpoint, because the charge carriers have to travel only a very short distance, but the anode surface is also directly opposite the substrate so that all of the particles starting from the anode land on the substrate. In addition, a sizeable portion of the scattering vapor travels from the magnetron cathode to this anode.

BRIEF SUMMARY OF INVENTION

Against this background, the object of the invention is to increase the quality of the substrate coatings by increasing the layer thickness uniformity and by decreasing the substrate contamination caused by the redundant anodes.

The invention achieves this object with a method, in which the negative potential is generated at a level that is no greater than the level of the cathode potential, thus preventing the electrode to be cleaned from being stripped to a greater extent than the same was coated in the pervious half cycle.

A special embodiment of the method provides that alternating voltage is generated and that the cathode potential is generated from this alternating voltage as the pulsing direct voltage without being electrically isolated. Each negative half cycle of this alternating voltage is applied in an alternating manner to one electrode respectively, whereas the respective positive half cycle of the alternating voltage is applied to the other respective electrode at a level that is decreased. As a result, the voltage at the electrodes never exceeds the normal anode voltage or the magnetron burning voltage.

An advantageous embodiment provides that the level of the negative half cycle at an electrode is decreased. As a result, it can be ensured that the material removal from the electrode will be no higher than that which would result in contamination.

Therefore, it is especially desirable that the level of the potential at the electrode is decreased in an adjustable way.

In addition to generating alternating voltage, it is also possible to generate direct voltage, which supplies in an electrically non-isolated manner the cathode with a negative direct voltage as the cathode potential, whereas this direct voltage supplies one electrode respectively with a negative potential and the respective other electrode with a potential, the level of which is decreased in comparison to the level of the positive potential of the direct voltage.

In order to separate the generation of voltage for the sputtering process from the ion etching of the electrodes, another embodiment of the invention provides that a first and a second direct voltage is generated and that this direct voltage supplies alternatingly in an electrically non-isolated manner the cathode with a negative direct voltage as the cathode potential, whereas these direct voltages supply one electrode respectively with a negative potential and the respective other electrode with a potential, the level of which is decreased in comparison to the level of the positive potential of the first and the second direct voltage.

In order to achieve the goal of avoiding uncontrolled etching, it is provided that the level of the negative potential is decreased in comparison to the level of the negative potential of the first and the second direct voltage.

The object of the invention is achieved with a device, in which the magnetron cathode and the electrodes are connected without electrical isolation to the voltage source by means of switching elements in such a manner that a negative and positive voltage, generated from the voltage source, can be applied alternatingly to the electrodes; and that the level of said negative and positive voltage is no greater than the cathode voltage.

One embodiment with the generation of an alternating voltage provides that the voltage source is designed as an alternating voltage source ($V_{mf}$) comprising a first and a second voltage output. The first voltage output is connected to a cathode of a first diode ($V_1$); and the second voltage output is connected to a cathode of a second diode ($V_2$). The anodes of the first ($V_1$) and the second diode ($V_2$) are connected together to the magnetron cathode. The first voltage output is connected directly to the first electrode; and the second voltage output is connected directly to the second electrode. Furthermore, the first electrode is connected to ground by way of a first diode/resistor series connection ($V_{zh1}$, $R_{zh1}$); and the second electrode is connected to ground by way of a second diode/resistor series connection ($V_{zh2}$, $R_{zh2}$). In this way the voltages at the electrodes shuttle between the positive anode voltage and the negative magnetron burning voltage.

One embodiment of the inventive device provides that the voltage source is designed as an alternating voltage source ($V_{mf}$) with a first and a second voltage output. The first voltage output is connected to a cathode of a first diode ($V_1$); and the second voltage output is connected to a cathode of a second diode ($V_2$). The anodes of the first ($V_1$) and the second diode ($V_2$) are connected together to the magnetron cathode. The first voltage output is connected to the first electrode by means of a third diode ($V_3$), which, in the event of a positive voltage at the first voltage output, is poled in the flow direction, and which is bridged with a first resistor ($R_1$). The second voltage output is connected to the second electrode by means of a fourth diode ($V_4$), which in the event of a positive voltage at the first voltage output is poled in the flow direction and which is bridged with a second resistor ($R_2$). The first electrode is connected to ground by way of a first diode/resistor series connection ($V_{zh1}$, $R_{zh1}$); and the second electrode is connected to ground by way of a second diode/resistor series connection ($V_{zh2}$, $R_{zh2}$). This configuration makes it possible to control specifically the etching procedure on the previously coated electrode.

The first ($R_1$) and/or the second resistor ($R_2$) is/are designed in a practical way as the adjustable resistor.

However, it is also possible to design both the first and the second resistor as variable resistors. To this end, the first resistor is designed as a variable resistor in the form of a drain/source zone of a first transistor ($V_5$), whose gate is connected to the middle of a series connection, which runs parallel to the drain/source zone and which comprises a first Zener diode ($V_7$) and a third resistor ($R_3$). The second resistor is designed as a variable resistor in the form of a drain/source zone of a first transistor ($V_6$), whose gate is connected to the middle of a series connection, which runs parallel to the drain/source zone and which comprises a second Zener diode ($V_8$) and a fourth resistor ($R_4$).

An advantageous embodiment provides that the first ($V_5$) and the second transistor ($V_6$) are designed as insulated gate bipolar transistors (IGBT).

Furthermore, it is desirable to design the alternating voltage source ($V_{mf}$) as a medium frequency voltage source.

Another embodiment of the invention provides that the voltage source is designed as a direct voltage source ($V_{g1}$) with a negative and a positive voltage output. The negative voltage output is connected to the magnetron cathode by way of a first switch ($S_1$); and the positive voltage output is connected to the magnetron cathode by way of a second switch. The negative and the positive voltage output is connected to the first and the second electrode by way of a switch quadripole comprising a third ($S_3$), a fourth ($S_4$), a fifth ($S_5$), and a sixth ($S_6$) in the form of a bridge circuit, where each bridge branch exhibits one of the switches. The first electrode is connected to ground by way of a first diode/resistor series connection ($V_{zh1}$, $R_{zh1}$); and the second electrode is connected to ground by way of a second diode/resistor series connection ($V_{zh2}$, $R_{zh2}$).

In order to supply separate voltage for the sputtering and the ion etching, the voltage source is designed as a first ($V_{g11}$) and as a second direct voltage source ($V_{g12}$) with one negative and one positive voltage output respectively. In this case both positive voltage outputs are connected together. The negative voltage output of the second direct voltage source ($V_{g12}$) is connected to the magnetron cathode by way of a first switch ($S_1$); and the positive voltage outputs are connected to the magnetron cathode by way of a second switch. The negative voltage output of the first direct voltage source ($V_{g11}$) and the positive voltage outputs are connected to the first and the second electrode by way of a switch quadripole comprising a third ($S_3$), a fourth ($S_4$), a fifth ($S_5$), and a sixth ($S_6$) in the form of a bridge circuit, where each bridge branch exhibits one of the switches. The first electrode is connected to ground by way of a first diode/resistor series connection ($V_{zh1}$, $R_{zh1}$); and the second electrode is connected to ground by way of a second diode/resistor series connection ($V_{zh2}$, $R_{zh2}$).

The fulfillment of the problem, proposed by the invention, can also be effectively facilitated by means of a physical configuration of the electrodes, which shall be explained below. In this case it is provided, first of all, that the magnetron cathode exhibits the shape of an elongated magnetron and that the electrodes are shielded by means of a shielding parallel to the elongation and by a substrate that is situated opposite the target of the magnetron.

With such an embodiment it is possible to achieve that the charge carriers may reach unobstructed the electrodes, which are switched as the anodes, without causing thereby the formation of locally different plasma concentrations in front of the electrodes, acting as the anode.

One embodiment provides that the electrodes are disposed with their shielding laterally next to the magnetron.

It is especially desirable to use the dark space shield, which already exists in any event, as the shielding of the electrodes by connecting the shielding to a dark space shield of the magnetron.

Since the shielding is heated as a consequence of the particle bombardment of the plasma, it is expedient to provide the shielding with water cooling.

In order to achieve even higher efficiency, it is provided that the electrodes are also arranged on the narrow sides of the elongated magnetron, preferably as the ring electrodes.

In an optimal design the shielding envelops the electrodes while simultaneously leaving unobstructed a slit. In this case it is desirable for production purposes that the shielding consists of a rectangular tube having a slit.

Especially practical is the arrangement of the shielding laterally next to the magnetron, where the slit is configured on the side facing away from the magnetron.

In the case of an elongated magnetron it may be desirable to arrange the electrodes with their shields on the side of the tube magnetron that faces away from the substrate, and that the slits of the shields, which are located opposite each other, point at each other.

In order to achieve even higher efficiency, it is provided that the spacing between the electrodes is adjusted in relation to each other, and that the distance between the electrodes and the shield is adjusted so as to prevent the formation of plasma.

Therefore, it is advantageous that the spacing between the electrodes ranges from 4 to 10 mm; and that the distance between the electrodes and the shield ranges from 4 to 10 mm.

Finally it is also possible to cool the electrodes directly by designing the electrodes in the shape of a tube and so as to convey coolant.

BRIEF DESCRIPTION OF THE DRAWING FIGURES

The invention is explained in detail below with reference to one embodiment. In the associated drawings FIG. 1 depicts a circuit configuration for redundant anode sputtering in accordance with the state of the art.

FIG. 2 depicts an inventive circuit configuration with a simple diode coupling to the alternating voltage source.

FIG. 3 depicts an inventive circuit configuration with an adjustable potential at the electrodes.

FIG. 4 depicts an inventive circuit configuration with variable resistors.

FIG. 5 depicts an inventive circuit configuration with a direct voltage source.

FIG. 6 depicts an inventive circuit configuration with two direct voltage sources.

FIG. 7 depicts an inventive circuit configuration, as depicted in FIG. 3, with a bridging R/C series connection.

DETAILED DESCRIPTION

Figure 8:
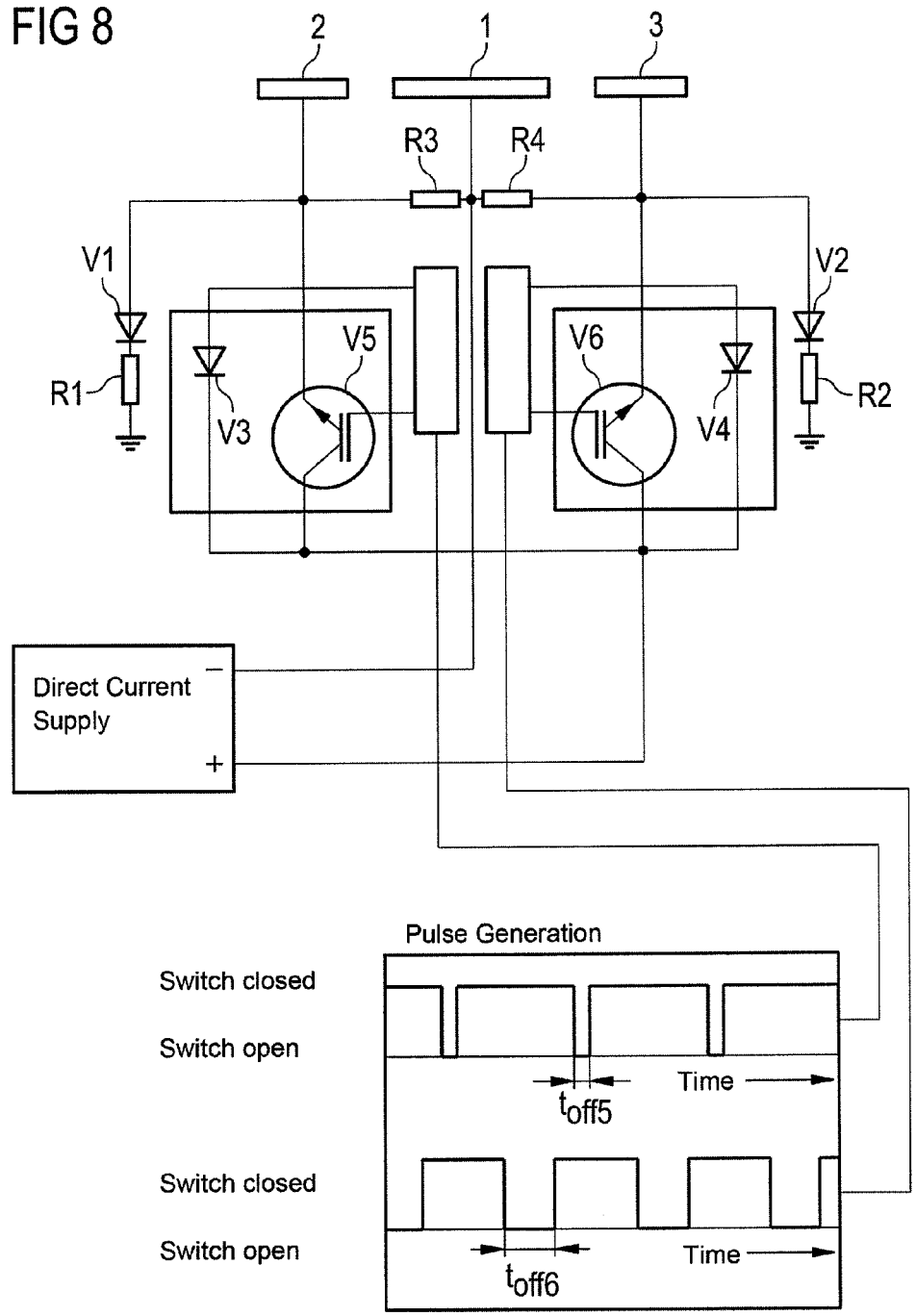
FIG. 8 depicts an inventive circuit configuration with a direct voltage source and variable resistors.

The known state of the art uses, as depicted in FIG. 1, a transformer, which has the drawbacks described in the introductory part.

As depicted in FIG. 2, a magnetron cathode can also be operated by means of two diodes—V1 and V2—with two additional electrodes. In this case the voltages at the electrodes shuttle only between the positive anode voltage and the negative magnetron burning voltage.

If the medium frequency generator Vmf supplies the pole 1 with a voltage, which is negative compared to pole 2 of the medium frequency generator Vmf, then the diode V1 conducts, the diode V2 blocks and the magnetron discharge ignites in the event of an adequate voltage level between the cathode and the electrode 2. At this point in time the electrode 2 acts as the anode of the magnetron discharge. Then the voltage at this electrode adjusts, in conformity with the conditions of the magnetron discharge, to +20 to +150V.

The electrode 1 is connected directly to the pole 1 of the Vmf. Therefore, apart from the conduction losses in the diode V1, said electrode has the same negative voltage in relation to the electrode 2 as the cathode.

Therefore, the effect of the ion etching on the electrode 1 takes place, but the voltage is only half the value of the configuration with the transformer in accordance with the state of the art in FIG. 1.

In the next half cycle the relationship reverses, so that at this point the pole 2 of the medium frequency generator Vmf is negative in relation to the pole 1 of the medium frequency generator Vmf. Therefore, at this stage the diode V2 conducts; the diode V1 blocks; and the electrode 1 acts as the anode of the magnetron discharge and at the electrode 2, which is now at the same potential as the cathode.

The technical implementation demands, besides the two diodes, also the wiring elements, which limit the overvoltages, and, in order to ignite the discharge reliably, a diode/resistor combination, which is referred to as Vzh1 and Rzh1 and Vzh2 and Rzh2 in FIG. 2.

Despite the voltage that is reduced to half of that in the original design, the etching effect on the electrodes is still very strong. Therefore, it is desirable to be able to control the etching procedure.

The circuit in FIG. 3 shows the solution:

The diodes V3 and/or V4 are inserted into the lines to the electrodes 1 and/or 2. These diodes are connected parallel to the variable resistors R1 and/or R2.

If the medium frequency generator Vmf supplies the pole 1 with a voltage, which is more negative than that supplied the pole 2, then the diode V1 conducts, the diode V2 blocks and the magnetron discharge ignites between the cathode and the electrode 2.

The diode V4 becomes conductive, whereas the diode V3 blocks. In this way a current flow between the electrode 1 and the pole 1 from the medium frequency generator Vmf can still take place only by way of the resistor R1. Depending on the size of the resistor, the electrode 1 is impinged on with fewer ions and, thus, is not etched as much.

In the next half cycle of the medium frequency voltage the relationship reverses; and the electrode 1 becomes the anode, whereas the electrode 2 is etched.

Owing to the size of the variable resistors R1 and/or R2, the flow through the electrodes 1 and/or 2 and, thus, the etching ion bombardment may be adjusted individually in such a manner as is necessary for the process.

In order to have the freedom of electronic control, it is desirable to use modern semiconductor components as the variable resistance.

The circuit in FIG. 4 shows the variant, in which an IGBT (IGBT: insulated gate bipolar transistor) is used as the variable resistor. The Zener diodes V7 and/or V8 become conductive, starting from a defined voltage, so that a current flows over the resistor R3 and/or R4. The resulting voltage drop drives the IGBT V5 and/or V6, so that exactly enough voltage remains over the Zener diodes. As a result, the voltage at the electrode becomes less by a constant amount than that of the Zener voltage of V7 and/or V8 at the magnetron cathode.

The IGBT containing protective diodes may be used for this circuit so that V3 and V5 and/or V4 and V6 are combined into one power module.

Similarly a conventional constant current circuit, which sets a defined ion current, can be used.

Whereas all of the aforementioned circuits must absolutely have a medium frequency generator, the RAS principle (RAS: redundant anode sputtering) is also possible with pulsing devices.

The circuit in FIG. 5 shows the configuration. The classical H bridge comprising the switches S3 to S6 cyclically reverses the polarity of the electrodes so that the cleaning effect is generated again.

The switches S1 and S2 offer another option that is not available with a medium frequency feed.

In the variants, according to FIG. 2 to FIG. 4, the cathode potential fluctuates between zero and the negative burning voltage of the cathode during the entire operating period. The side diagrams depicting the characteristics of the voltages over time illustrate this behavior.

In the case of highly insulating materials like $SiO_2$, this permanent orientation of the potential is deleterious. It leads to charges on the target, which in turn end in over-arcing with electric arcs. A more reliable remedy against these charges is to reverse the polarity of the target surface adequately fast so that the charge carriers in the plasma are neutralized (see Szczyrbowsko and Teschner "Reactive Sputtering of SiO2 Layers . . . ", SVC 1995).

Time 0: all switches are open.

Time 1: S1, S4, S5 closed. The discharge ignites and burns between the cathode and the electrode 2. The electrode 1 is etched. The electrode 1 is supplied with the same voltage as the cathode.

Time 2: S1 and S4 are opened. The discharge is interrupted.

Time 3: S2 is closed. The charged cathode is now more positive than the electrode 1 and, thus, extracts the electrons from the remaining plasma and, in so doing, discharges itself.

Time 4: All of the switches are open.

Time 5: S1, S3, S6 closed. The discharge ignites and burns between the cathode and the electrode 1. The electrode 2 is etched. The electrode 2 is supplied with the same voltage as the cathode.

Time 6: S1 and S3 are opened. The discharge is interrupted.

Time 7: S2 is closed. The charged cathode is now more positive than the electrode 2 and, thus, extracts the electrons from the remaining plasma and, in so doing, is discharged.

Time 8: All of the switches are open.

Thereafter the cycle repeats.

IGBTs, which are present in the pulse circuits, are used for the switches.

If in this case the object is also to achieve an ion etching process that can be controlled, the circuit, shown in FIG. 6, can be modified. The current supply is divided into 2 current supplies—the first for sputtering and the second for ion etching of the electrodes. Since the two current supplies can be adjusted independently of each other, the voltage level at the electrodes can also be adapted to the technological requirements during the etching phase.

The anodes 2 and 3 in FIG. 7 are connected to an RC element from C1 and R3. The capacitor C1 serves to return the positive voltage to the negative branch, which is blocked by the diodes. Whereas without a capacitor the diodes emit their stored charge into the etching discharge and, thus, always result in a minimum etching procedure, the charge of the diodes is conveyed past the plasma by way of the RC element so that it is possible to totally suppress the etching.

The resistor R3 in the RC element serves to limit the pulse currents to the allowable value for the diodes used in the diode module 8.

Another modification of the RAS principle is the switched double anode system, which is shown in FIG. 8. In contrast to the original RAS principle, in this case, instead of the medium frequency supply 9, a direct current supply is used. In this case, the minus pole of the direct current supply is permanently connected to the magnetron cathode 1. The anodes 2 and 3 are connected to the cathode by way of the resistors R3 and R4. In addition, each anode is connected to the plus pole of the direct current supply by way of a switch, shown as the IGBTs V5 and V6 in FIG. 8.

If the switches V5 and V6 are closed, this configuration functions as a classical direct current sputtering system.

If one of the switches is opened, then the potential of the electrode, which is connected to the open switch, becomes highly negative owing to the resistor, which connects this electrode to the cathode, so that this electrode can no longer act as the anode of the gas discharge, but rather acts as the additional cathode. The other electrode, which is connected to the closed switch, takes over the entire anode current of the discharge in the period of time in which a switch is opened.

Since this additional cathode is no longer promoting the magnetic field, very little current is contributed. However, the plasma cloud that is generated by the magnetron cathode delivers a sufficiently high amount of positive ions that an ion extraction takes place owing to the negative potential. This ion extraction leads to etching and, thus, to the cleaning of the anode surface. One of the two switches must always be closed so that the sputtering discharge finds its anode.

FIG. 8 shows an example of the pulse train, during which the opening times of the switches $t_{off5}$ and $t_{off6}$ vary, because with different opening times the electrode coating that may or may not vary can be counteracted. The cleaning effect can be metered by adjusting the opening times individually.

This individual adjustment is especially important because the coating of the electrodes changes as a function of the supplied cathode power and the prevailing working pressure.

The logical cycle duration for the repeated opening of the switches depends on the material properties of the resulting layer. They are in a range of a few Hertz up to 100 kHz. In the case of highly insulating layers it must be prevented due to the fast cleaning, that the anode can be completely coated in one period.

The combinations of diode and resistor V1/R1 and/or V2/R2 serve to promote the initial ignition of the magnetron discharge.

The diodes V3 and/or V4 belong to the respective IGBT and serve to protect it against polarity reversal.

In order to achieve a uniform coating with a magnetron system, the construction of the anode must be designed, inter alia, in such a manner that the charge carriers may reach the anode without any obstruction and without thereby causing locally different plasma concentrations to develop in front of the anodes.

This system was modified (see also FIG. 9 to FIG. 11) to the extent that the two anode carrying rods 2 and 3, which are necessary for the RAS system, were mounted on the two longer sides of the cathode 1 and were separated from the substrate by means of the areas, connected to the dark space shield 4 and 5. Another area was inserted on the side of the anode-carrying rods that face away from the target, so that the cross section of the part 5 exhibits a U-shape.

The surfaces of the parts 4 and 5 are exposed to the particle bombardment of the plasma, so that in the case of high performance cathodes they are designed as water cooled sheet metal plates.

Figure 9:
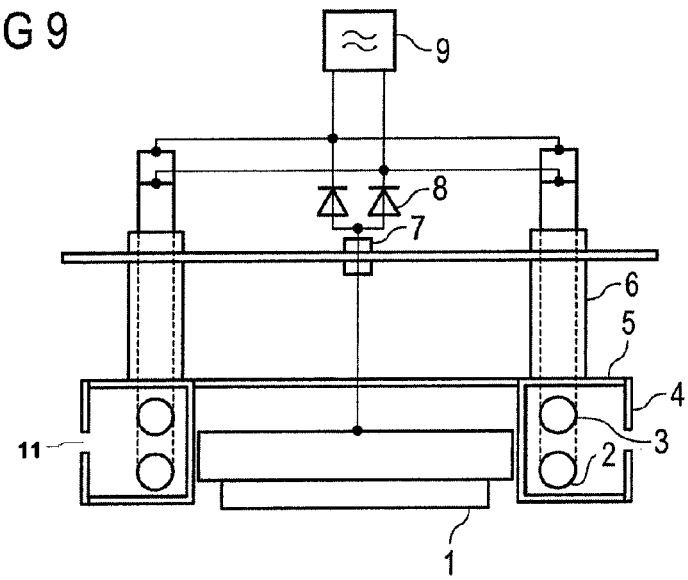
FIG. 9 is a front view of a magnetron cathode with electrodes, which are laterally arranged.
Figure 10:
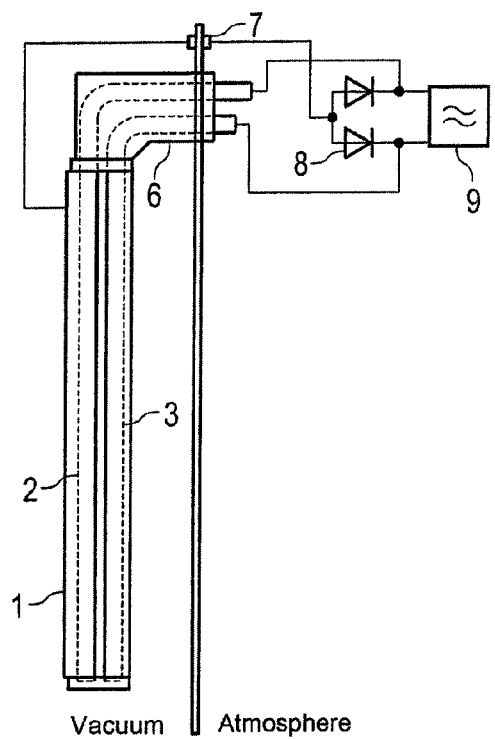
FIG. 10 depicts the insertion of the electrodes into the vacuum chamber.
Figure 11:
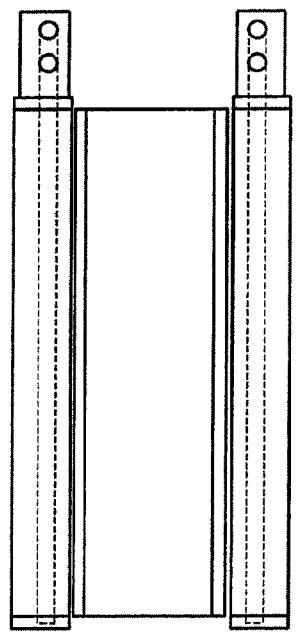
FIG. 11 is a bottom view of the magnetron cathode.

FIG. 10 is a side view from the left hand side of FIG. 9; FIG. 11 is a bottom view of FIG. 9.

The electric wiring is rendered only symbolically. The respective upper anode 3 is connected to a pole of the medium frequency supply 9. The respective bottom anode 2 is connected to the other pole of the medium frequency supply 9. The diode module 8 is connected to the two poles of the medium frequency supply. The anodes of the diode module 8 are connected to the magnetron cathode 1.

Figure 21:
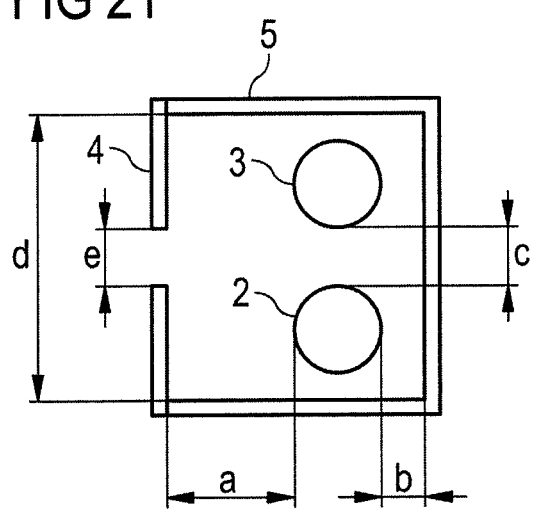
FIG. 21 is a cross sectional view of the electrodes with shielding and cooling.

The effect of the anode and the amount of the injected etching power can be controlled by the opening in the area 4. For the function of the gas discharge it is necessary that the anode drop in front of the anode carrying rods can be implemented in its entirety. This means for the design instructions that there may be no additional parts that restrict the plasma in a space interval of 40 to 80 mm in front of the anodes 2 and 3. In FIG. 21 this measure is labeled a.

Therefore, the two legs of the part 5 are designed to this length. The ends of these legs support the end plates 4, which permit the cross section, in which the anodes 2 and 3 are located, to become a rectangular tube, which is opened with a slit 11 parallel to the longitudinal expansion of the target. The width of the slit was marked with the reference letter e in FIG. 21. The charge carriers penetrate from the plasma space into this slit. Since the ions and the electrons exhibit different ranges of motion, it is possible that in the case of a small slit width e preferably the electrons reach the anodes, but the ions are impeded. Correspondingly the etching effect at the anodes decreases. On the other hand, a small slit width e causes the substrate to be well shielded against impurities from the anode.

In order to make sure that the discharge in front of the anodes 2 and 3 propagates in the direction of the slit opening 11, the distance b between the anodes 2 and 3 and the dark space shield 5 is to be adjusted to 4 to 10 mm, so that the plasma is quenched therein. In order to prevent a direct plasma formation between the anodes 2 and 3, the distance between the anodes 2 and 3, which is marked with the reference letter c in FIG. 21, is also to be adjusted to 4 to 10 mm.

In order to be able to define the electrically effective anode, the parts of the anodes 2 and 3 that are not to make contact with the plasma, are covered with the insulators 6. Owing to the proximity to the plasma space, insulating materials—for example, quartz glass or ceramic—are to be used that can withstand the stresses, which are unavoidable in the plasma, like the ion bombardment and ultraviolet radiation.

Figure 12:
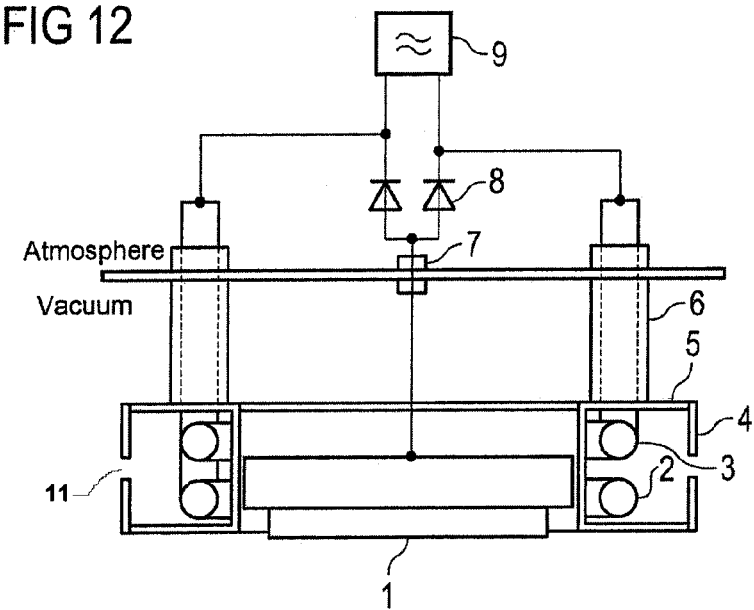
FIG. 12 is a front view of a magnetron cathode with a ring-shaped arrangement of the electrodes.
Figure 13:
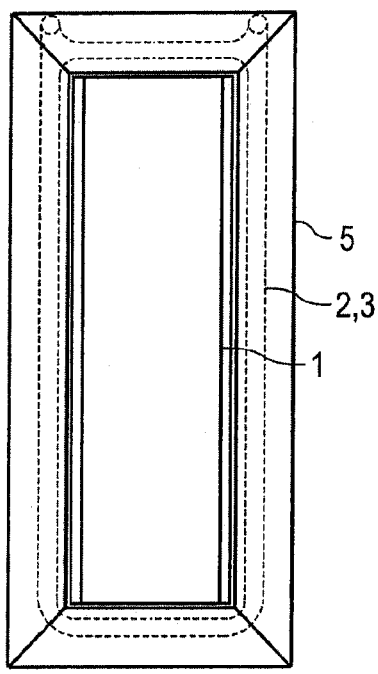
FIG. 13 is a bottom view of the configuration, according to FIG. 12.

An even higher uniformity of the layer thickness can be achieved if the magnetron cathode is surrounded by anodes on all sides. FIG. 13 is a bottom view of FIG. 12, where the lateral anodes 2 and 3 were configured as rings 2 and 3. In the middle of the rings there is located the magnetron cathode 1. The rings are housed in the above described tube cross section 4 and 5. In contrast to the rod design, in the ring system the cover also extends over the face sides of the cathode so that the dark space shields 4 and 5 also form rings.

In the case of high performance cathodes the anodes must be water cooled, because approximately 10% of the entire discharge power is transferred to the anodes. In the case of rod anodes the cooling water is conveyed back and forth in the rod owing to the double tube design. In the case of the ring anodes the water is fed into the ring in a T-shaped segment and, after passage through the entire ring, is carried away again at the same T-shaped segment.

Figure 20:
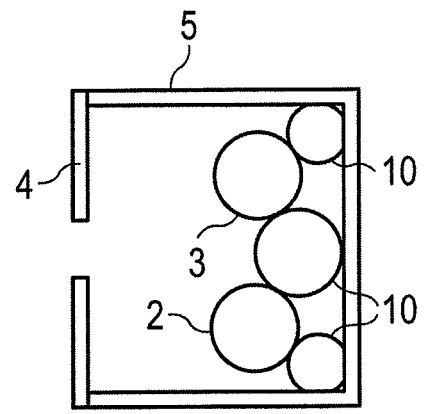
FIG. 20 is a cross sectional view of the electrodes with shielding.

The ring design has an additional advantage over the rods. The ring design simplifies the insulated attachment of the anodes. FIG. 20 shows that the above described spacing c between the ring anodes 2 and 3 in relation to each other and the distance b of the ring anodes 2 and 3 from the dark space shield 5 are adjusted by ceramic cylinders 10. In this case they are short ceramic rods, which are distributed over the length of the anode rings. Owing to the adjusted spacing, which causes a dark space quenching of the plasma on the inside of the anode rings 2 and 3, these ceramic rods have no influence on the homogeneity of the plasma on the front side of the anodes.

FIG. 9 to FIG. 13 show the systems, in which the magnetron cathode 1 is a planar magnetron. However, the same technique can be applied to a cylindrical magnetron.

FIG. 14 to FIG. 19 show that the ring anodes 2 and 3 are situated in a plane behind the cylindrical cathode 1, facing away from the substrate. The electrical wiring and the geometrical configuration of the anode tubes 2 and 3 in the dark space shield 4 and 5 are identical to those described above.

Figure 14:
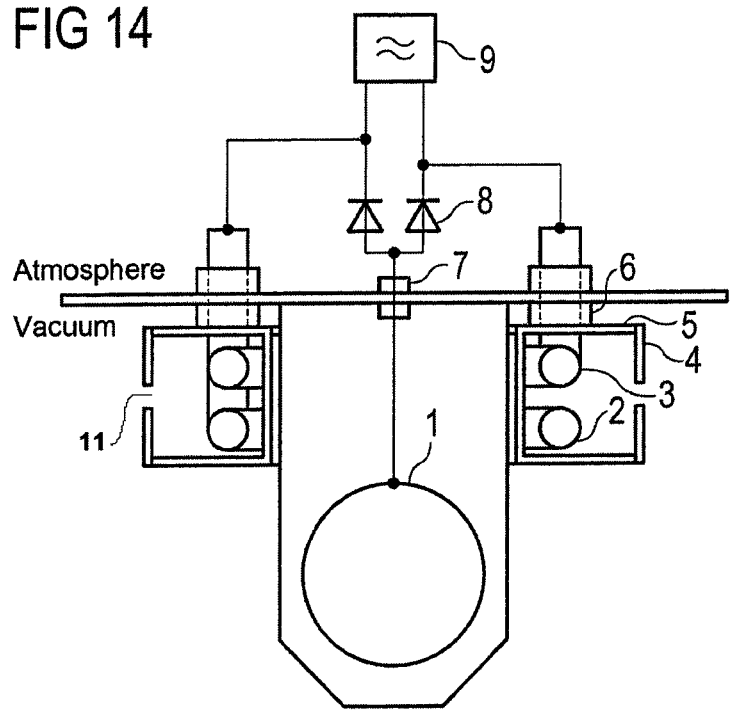
FIG. 14 depicts an inventive configuration with a tube magnetron.
Figure 15:
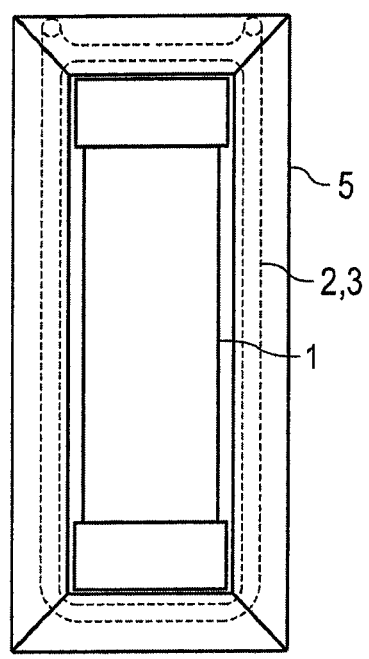
FIG. 15 is a bottom view of the configuration, according to FIG. 14.

FIG. 14 and FIG. 15 show that the dark space shield 4 and 5 and the anode rings 2 and 3 envelop the entire device of the cylindrical magnetron—that is, including the holders for the target tube. In this case the slit opening 11 points outwardly.

Figure 16:
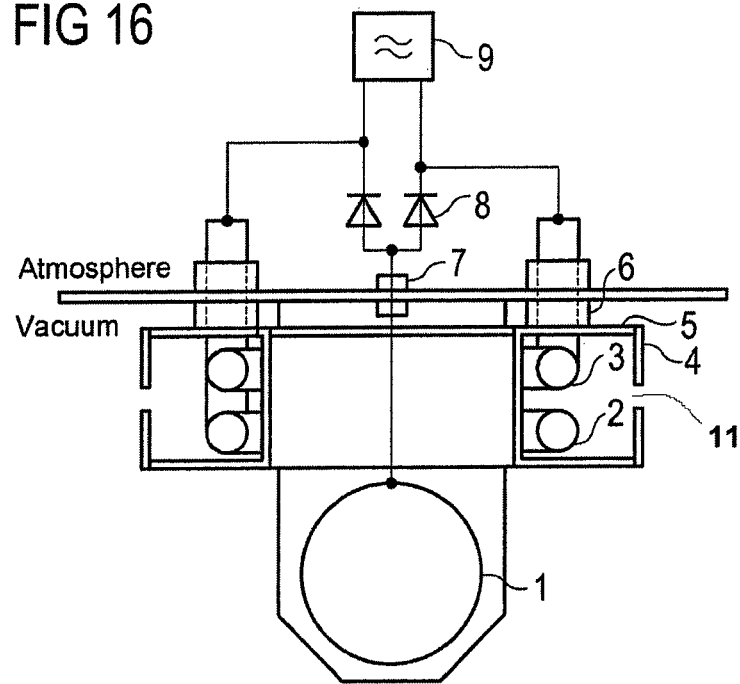
FIG. 16 is a front view of a second inventive embodiment with the use of a tube magnetron with a slit that is located externally.
Figure 17:
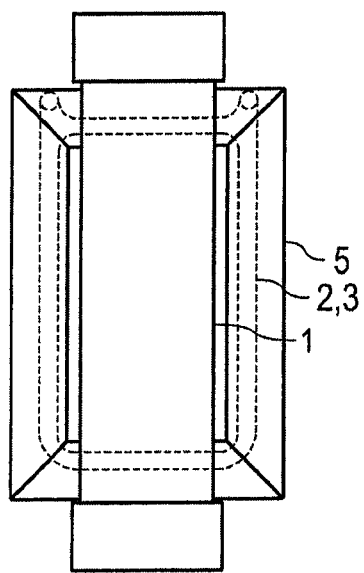
FIG. 17 is a bottom view of the embodiment, according to FIG. 16.

FIG. 16 and FIG. 17 show that the dark space shield 4 and 5 and the anode rings 2 and 3 envelop only the space below the target tube. In this case the slit opening 11 points outwardly.

Figure 18:
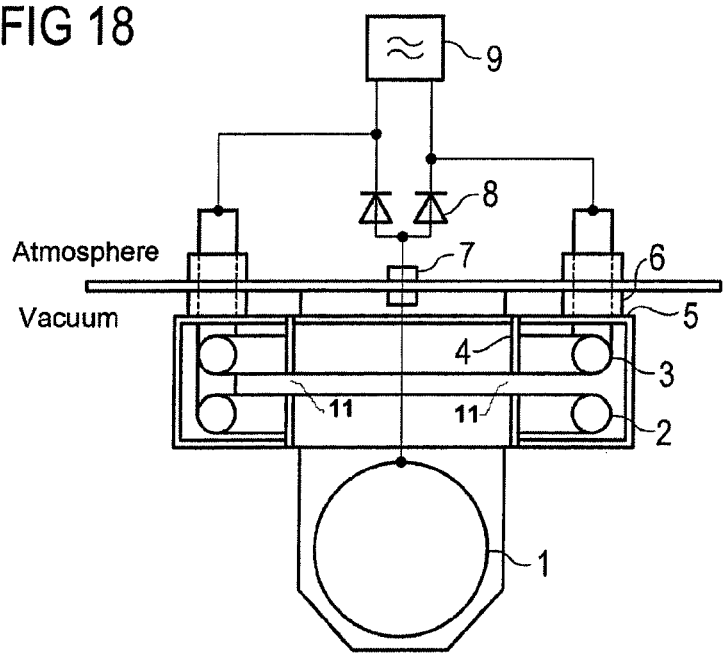
FIG. 18 is a front view of a third inventive embodiment with the use of a tube magnetron with a slit that is located internally.
Figure 19:
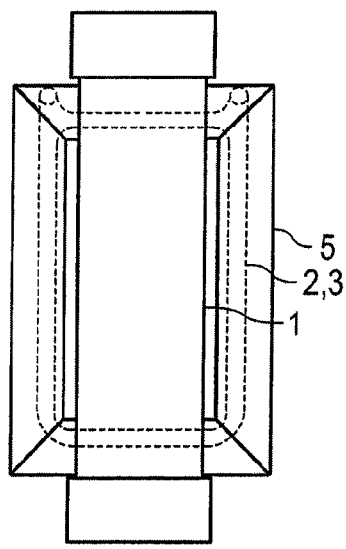
FIG. 19 is a bottom view of the embodiment, according to FIG. 18.

FIG. 18 and FIG. 19 show that the dark space shield 4 and 5 and the anode rings 2 and 3 envelop only the space below the target tube. In this case the slit opening 11 points inwards.

The control of the etching of the anodes by adjusting the slit width e in the above described way can also be used to change locally the plasma intensity by means of the locally different slit width and, thereby, to influence the layer thickness distribution on the substrate. Hence, the non-homogeneity, which may have been caused by other influencing factors, may be compensated.

It follows from the description that the etching of the anodes may be decreased, but not totally suppressed with the slit width e.

The ideal situation would be that the undesired coating of the anodes and the cleaning by means of etching were exactly balanced. However, this state cannot be implemented by mechanical means. For this reason the circuits in FIG. 3 and FIG. 4 were expanded to include another branch, as depicted in FIG. 7.

The invention claimed is:

1. Device for coating a substrate by use of redundant anode sputtering, comprising: a vacuum chamber, a magnetron cathode, two electrodes and a voltage source, wherein the magnetron cathode and the electrodes are connected without electrical isolation to the voltage source by switching elements in such a manner that a negative voltage and a positive voltage, generated from the voltage source, are applied alternatingly to the electrodes, and a level of said negative voltage and said positive voltage is no greater than a cathode voltage, and wherein the voltage source comprises an alternating voltage source with a first voltage output and a second voltage output; the first voltage output is connected to a cathode of a first diode; and the second voltage output is connected to a cathode of a second diode; and anodes of the first diode and the second diode are connected together to the magnetron cathode; and the first voltage output is connected to the first electrode of the two electrodes by a third diode, which when the first voltage output is a positive voltage, is poled in a flow direction, and which is bridged with a first resistor; and the second voltage output is connected to the second electrode of the two electrodes by a fourth diode, which when the second voltage output is a positive voltage, is poled in the flow direction, and which is bridged with a second resistor.

2. Device, as claimed in claim 1, wherein the first electrode is connected to ground by way of a first diode/resistor series connection; and the second electrode is connected to ground by way of a second diode/resistor series connection.

3. Device, as claimed in claim 2, at least one of the first and the second resistor comprise an adjustable resistor.

4. Device, as claimed in claim 2, wherein the first resistor comprises a variable resistor in the form of a drain/source zone of a first transistor, whose gate is connected to a middle of a series connection, which runs parallel to the drain/source zone and which comprises a first Zener diode and a third resistor; and the second resistor comprises a variable resistor in the form of a second drain/source zone of a second transistor, whose gate is connected to a middle of a series connection, which runs parallel to the second drain/source zone and which comprises a second Zener diode and a fourth resistor.

5. Device, as claimed in claim 4, wherein the first transistor and the second transistor comprise insulated gate bipolar transistors (IGBT).

6. Device, as claimed in claim 1, wherein the alternating voltage source comprises a medium frequency voltage source.

7. Device, as claimed in claim 1, wherein the magnetron cathode comprising a magnetron with elongation, and the electrodes are shielded by shielding parallel to the elongation and by a substrate that is situated opposite a target of the magnetron.

8. Device, as claimed in claim 7, wherein the electrodes are disposed with the shielding laterally next to the magnetron.

9. Device, as claimed in claim 7, wherein the shielding is connected to a dark space shield of the magnetron.

10. Device, as claimed in claim 7, wherein the shielding is provided with water cooling.

11. Device, as claimed in claim 7, wherein the electrodes are also arranged on narrow sides of the magnetron.

12. Device, as claimed in claim 7, wherein the shielding envelops the electrodes while simultaneously leaving unobstructed a slit.

13. Device, as claimed in claim 12, wherein the shielding comprises a rectangular tube having a slit.

14. Device, as claimed in claim 12, wherein the shielding is disposed laterally next to the magnetron, and the slit is disposed on a side facing away from the magnetron.

15. Device, as claimed in claim 7, wherein the magnetron comprises a tube magnetron; and the electrodes with their shields are disposed on a side of the tube magnetron that faces away from the substrate; and slits of the shields, which are located opposite each other, point at each other.

16. Device, as claimed in claim 7, wherein spacing between the electrodes is adjusted in relation to each other, and the spacing between the electrodes and the shield is adjusted so as to prevent formation of plasma.

17. Device, as claimed in claim 16, wherein the spacing between the electrodes ranges from 4 to 10 mm.

18. Device, as claimed in claim 16, wherein the spacing between the electrodes and the shield ranges from 4 to 10 mm.

19. Device, as claimed in claim 7, wherein the electrodes are in a shape of a tube so as to convey coolant.

20. Device, as claimed in claim 11, wherein the electrodes comprise ring electrodes.

* * * * *